(12) United States Patent
Cao et al.

(10) Patent No.: US 11,121,245 B2
(45) Date of Patent: Sep. 14, 2021

(54) FIELD PLATE STRUCTURES WITH PATTERNED SURFACE PASSIVATION LAYERS AND METHODS FOR MANUFACTURING THEREOF

(71) Applicant: Efficient Power Conversion Corporation, El Segundo, CA (US)

(72) Inventors: Jianjun Cao, Torrance, CA (US); Jie Hu, El Segundo, CA (US); Yoganand Saripalli, El Segundo, CA (US); Muskan Sharma, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 16/793,590

(22) Filed: Feb. 18, 2020

(65) Prior Publication Data

US 2020/0273977 A1 Aug. 27, 2020

Related U.S. Application Data

(60) Provisional application No. 62/808,978, filed on Feb. 22, 2019.

(51) Int. Cl.
*H01L 29/778* (2006.01)
*H01L 29/78* (2006.01)
(Continued)

(52) U.S. Cl.
CPC .......... *H01L 29/78* (2013.01); *H01L 29/2003* (2013.01); *H01L 29/404* (2013.01);
(Continued)

(58) Field of Classification Search
CPC ........... H01L 29/512; H01L 29/51–518; H01L 29/66431; H01L 29/66462; H01L 29/778–7789; H01L 29/402–407
See application file for complete search history.

(56) References Cited

U.S. PATENT DOCUMENTS 8,076,698 B2 12/2011 Ueda et al.
8,350,294 B2 1/2013 Lidow et al.
(Continued)

FOREIGN PATENT DOCUMENTS

CN 104299999 A 1/2015
TW 201119033 A 6/2011
(Continued)

OTHER PUBLICATIONS

High breakdown voltage AlGaN/GaN HEMT with high-K/low-K compound passivation, by Jiangfeng Du, Nanting Chen, Peilin Pan, Zhiyuan Bai,Liang Li, Jianghui Mo and Qi Yu, in Electronics Letters Jan. 8, 2015 vol. 51 No. 1 pp. 104-106 (Year: 2015).*
(Continued)

*Primary Examiner* — Eric A. Ward
(74) *Attorney, Agent, or Firm* — Blank Rome LLP (57) ABSTRACT

A gallium nitride (GaN) transistor which includes multiple insulator semiconductor interface regions. Two or more first insulator segments and two or more second insulator segments are positioned between the gate and drain contacts and interleaved together. At least one first insulator segment is nearer to the gate contact than the second insulator segments. At least one second insulator segment is nearer to the drain contact than the first insulator segments. The first and second insulators are chosen such that a net electron donor density above the channel under the first insulator segments is lower than a net electron density above the channel under the second insulator segments. The first insulator segments reduce gate leakage and electric fields near the gate that cause high gate-drain charge. The second insulator segments reduce electric fields near the drain contact and provide a high density of charge in the channel for reduced on-resistance.

21 Claims, 10 Drawing Sheets

(51) Int. Cl.
*H01L 29/51* (2006.01)
*H01L 29/20* (2006.01)
*H01L 29/40* (2006.01)
*H01L 29/66* (2006.01)

(52) U.S. Cl.
CPC .......... *H01L 29/511* (2013.01); *H01L 29/512* (2013.01); *H01L 29/66477* (2013.01); *H01L 29/778* (2013.01)

(56) References Cited

U.S. PATENT DOCUMENTS

| | | |
|---|---|---|
| 8,664,695 B2 | 3/2014 | Wu et al. |
| 9,831,515 B2 | 11/2017 | Chu et al. |
| 10,096,702 B2 | 10/2018 | Beach et al. |
| 2006/0145189 A1 | 7/2006 | Beach |
| 2009/0224288 A1 | 9/2009 | Parikh et al. |
| 2011/0049526 A1 | 3/2011 | Chu et al. |
| 2013/0092958 A1 | 4/2013 | Chu et al. |
| 2013/0234153 A1 | 9/2013 | Lidow et al. |
| 2013/0240911 A1 | 9/2013 | Beach |
| 2014/0061659 A1 | 3/2014 | Teplik et al. |
| 2015/0155358 A1 | 6/2015 | Briere |
| 2017/0077284 A1* | 3/2017 | Ono ................ H01L 29/66462 |
| 2017/0352754 A1 | 12/2017 | Beach et al. |
| 2018/0097081 A1 | 4/2018 | Cao et al. |
| 2019/0123151 A1* | 4/2019 | Li ........................... H01L 29/78 |
| 2020/0052103 A1* | 2/2020 | Tao ..................... H01L 29/0615 |

FOREIGN PATENT DOCUMENTS

| | | |
|---|---|---|
| TW | 201511261 A | 3/2015 |
| TW | 201546992 A | 12/2015 |
| TW | 201813092 A | 4/2018 |

OTHER PUBLICATIONS

S.J.Kim et al., "Reduction of the Gate Leakage Current in Binary-Trench-Insulated Gate AlGaN/GaN High-Electron-Mobility Transistors," Journal of the Korean Physical Society, vol. 55, No. 1, pp. 356-361, Jul. 2009.

B. Green et al., "The Effect of Surface Passivation on the Microwave Characteristics of Undoped AlGaN/GaN HEMT's," IEEE Electron Device Letters, vol. 21, No. 6, Jun. 2000, pp. 268-270.

K. Enisherlova et al., "Study of the effect of passivation layers on capacitance of AlGaN/GaN heterostructures," Modern Electronic Materials 2 (2016), pp. 131-137.

\* cited by examiner

FIELD PLATE STRUCTURES WITH PATTERNED SURFACE PASSIVATION LAYERS AND METHODS FOR MANUFACTURING THEREOF

This application claims the benefit of U.S. Provisional Application No. 62/808,978, filed on Feb. 22, 2019, titled "Field Plate Structures with Patterned Surface Passivation Layers and Method of Manufacturing Same", the entire contents of which are hereby incorporated by reference herein.

BACKGROUND

1. Field of the Invention

The present invention relates to the field of column III nitride transistors such as gallium nitride (GaN) transistors. More particularly, the invention relates to GaN transistors with multiple insulator semiconductor interface regions.

2. Description of the Related Art

GaN semiconductor devices are increasingly desirable for power semiconductor devices because of their ability to carry large current and support high voltages. Development of these devices has generally been aimed at high power, high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET).

A GaN HEMT device includes a nitride semiconductor with at least two nitride layers. Different materials formed on the semiconductor or on a buffer layer cause the layers to have different band gaps. The different material in the adjacent nitride layers also causes polarization, which contributes to a conductive two-dimensional electron gas (2DEG) region near the junction of the two layers, specifically in the layer with the narrower band gap.

The nitride layers that cause polarization typically include a barrier layer of aluminum gallium nitride (AlGaN) adjacent to a layer of GaN to include the 2DEG, which allows charge to flow through the device. This barrier layer may be doped or undoped. Because the 2DEG region exists under the gate at zero gate bias, most nitride devices are normally on, or depletion mode devices. If the 2DEG region is depleted, i.e. removed, below the gate at zero applied gate bias, the device can be an enhancement mode device. Enhancement mode devices are normally off and are desirable because of the added safety they provide and because they are easier to control with simple, low cost drive circuits. An enhancement mode device requires a positive bias applied at the gate in order to conduct current.

Figure 1:
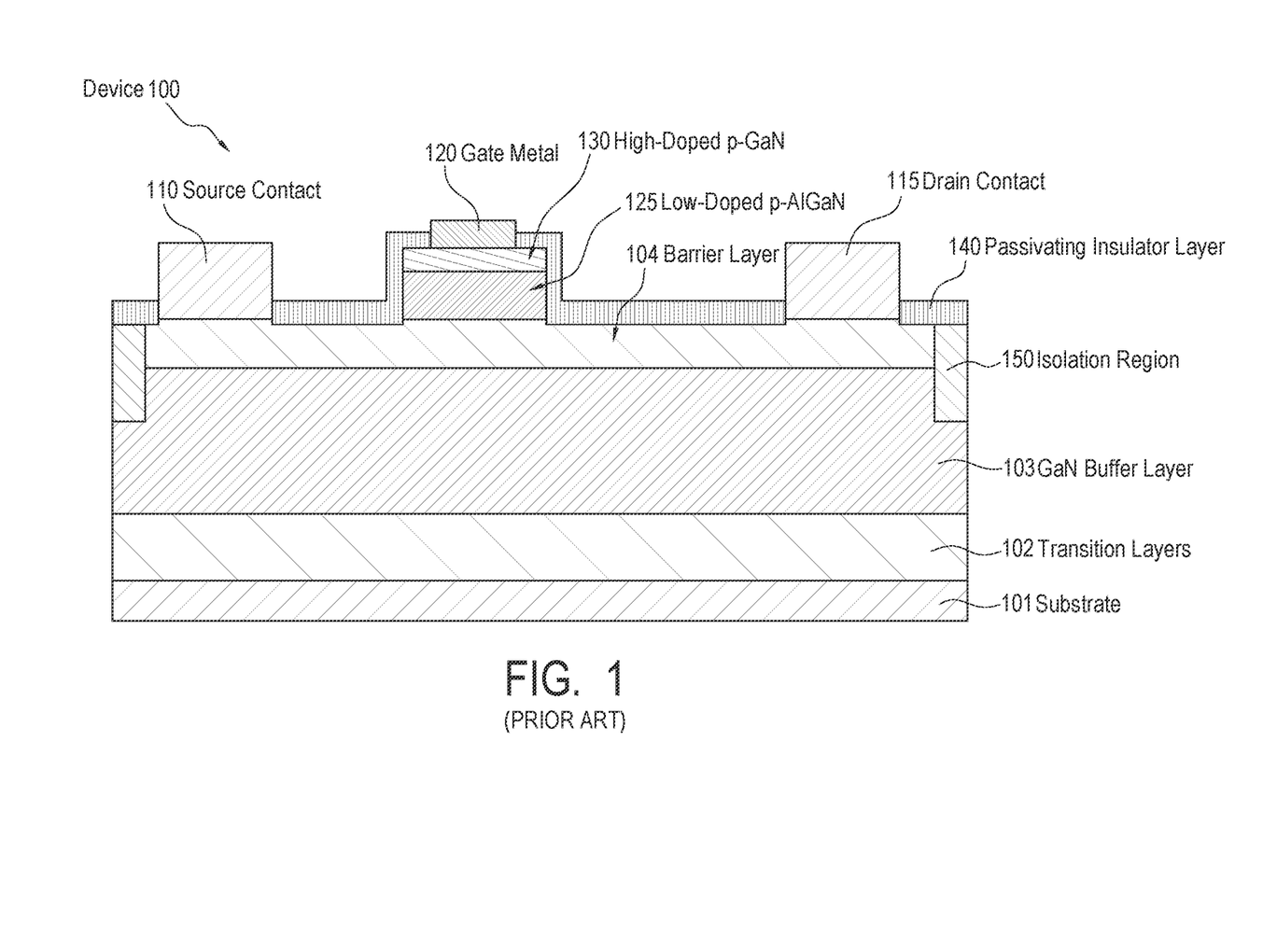
FIG. 1 illustrates a cross-sectional view of a conventional GaN transistor with a single layer of a surface passivating insulator.

FIG. 1 illustrates a cross-sectional view of a conventional enhancement mode GaN transistor 100 with a single layer of a surface passivating insulator layer 140. Device 100 is described more fully in U.S. Pat. No. 8,076,698, issued to Ueda et al. Device 100 includes a substrate 101 that can be composed of silicon (Si), silicon carbide (SiC), sapphire, or other materials. Transition layers 102 can be composed of aluminum nitride (AlN) and AlGaN that is about 0.1 to about 1.0 micrometers (μm) in thickness. GaN buffer layer 103 can be composed of GaN that is about 0.5 to about 10 μm in thickness. Barrier layer 104 can be composed of AlGaN where the Al to Ga ratio is about 0.1 to about 0.5 with a thickness from about 0.005 to about 0.03 μm. A portion of the barrier layer 104 is covered by a low-doped p-type AlGaN 125, which is covered by a high-doped p-type AlGaN 130.

Isolation regions 150 can be used to electrically isolate device 100 from an adjacent semiconductor device. The isolation regions 150 can be composed of boron ions implanted into portions of the barrier layer 104 and the GaN buffer layer 103 to increase the resistance of isolation regions of these layers. Ohmic contact metals for the source contact 110 and the drain contact 115 can be composed of titanium (Ti) and Al with a capping metal such as nickel (Ni) and gold (Au). A gate metal contact 120 can be composed of a Ni and Au metal overlaid the high-doped p-type AlGaN 130. A passivating insulator layer 140 can be composed of SiN and covers the top surface of the barrier layer 104 around the source contact 110, the drain contact 115, and the gate metal 120.

Figure 2:
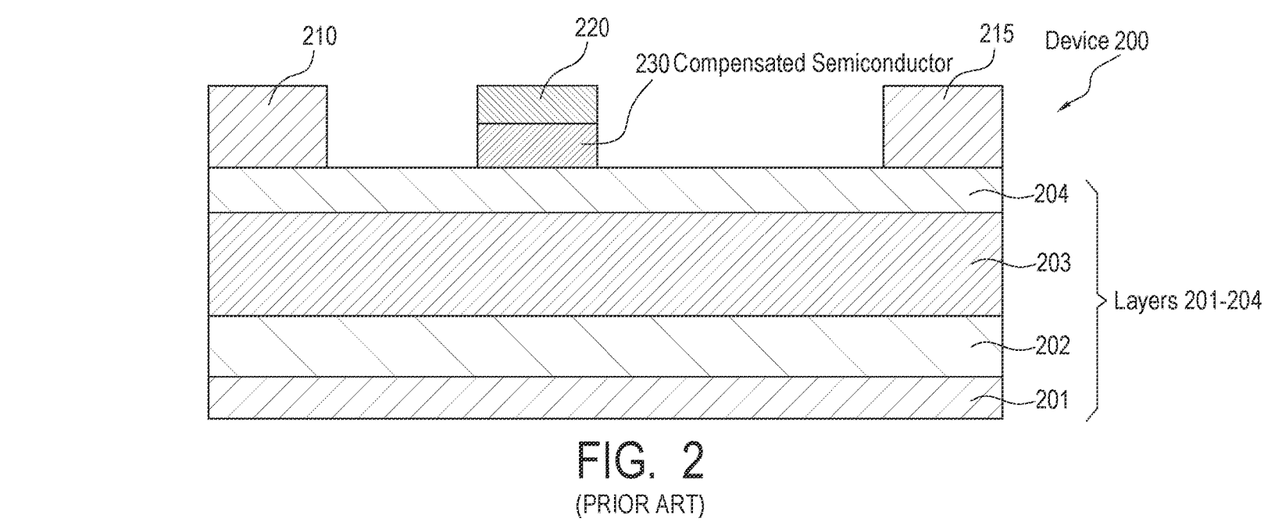
FIG. 2 illustrates a cross-sectional view of a conventional GaN transistor without a surface passivating insulator.

FIG. 2 illustrates a cross-sectional view of a conventional GaN transistor 200 without a surface passivating insulator. Device 200 is described more fully in co-owned U.S. Pat. No. 8,350,294, the disclosure of which is herein incorporated by reference. Layers 201 and 202 can be substantially the same as layers 101 and 102, respectively, described herein with reference to device 100 in FIG. 1. Buffer layer 203 can be composed of an indium aluminum gallium nitride (InAlGaN) with any concentration of In and Al, including 0% In and/or Al, and has a thickness between 0.5 and 3 μm. The barrier layer 204 can be composed of AlGaN with an Al concentration of about 10% to 50%, and has a thickness between 0.005 and 0.03 μm. Source and drain contacts 210 and 215, respectively, are formed of Ti or Al with a capping metal such as Ni and Au or Ti and TiN.

A gate contact 220 is arranged between the source and drain contacts and over a compensated semiconductor layer 230. The compensated semiconductor layer 230 can be composed of AlGaN or GaN with a deep level passivated p-type impurity such as, for example, magnesium (Mg), zinc (Zn), beryllium (Be), cadmium (Cd), or calcium (Ca). The gate contact 220 can be formed of tantalum (Ta), Ti, TiN, tungsten (W), or $WSi_2$, and has a thickness of between 0.05 and 1.0 μm. The high doping level of compensated semiconductor layer 230 causes device 200 to be an enhancement mode device. The compensated semiconductor layer 230 reduces gate leakage during device operation and the gate capacitance of device 200.

The conventional GaN transistors 100 and 200 shown in FIGS. 1 and 2 have several disadvantages. In most Si devices, the interface between the insulator and barrier is not a critical parameter; however, in GaN transistors this interface is a critical parameter dominating device performance. A single layer of a surface passivating insulator layer such as layer 140 in device 100 shown in FIG. 1 can be chosen to reduce leakage current ($I_{LEAKAGE}$) and gate-to-drain capacitance ($C_{GD}$), or it can be chosen for a high electron density in the channel and a low electric field near the drain contact. The passivating insulator layer cannot be made to do both at the same time.

Figure 3:
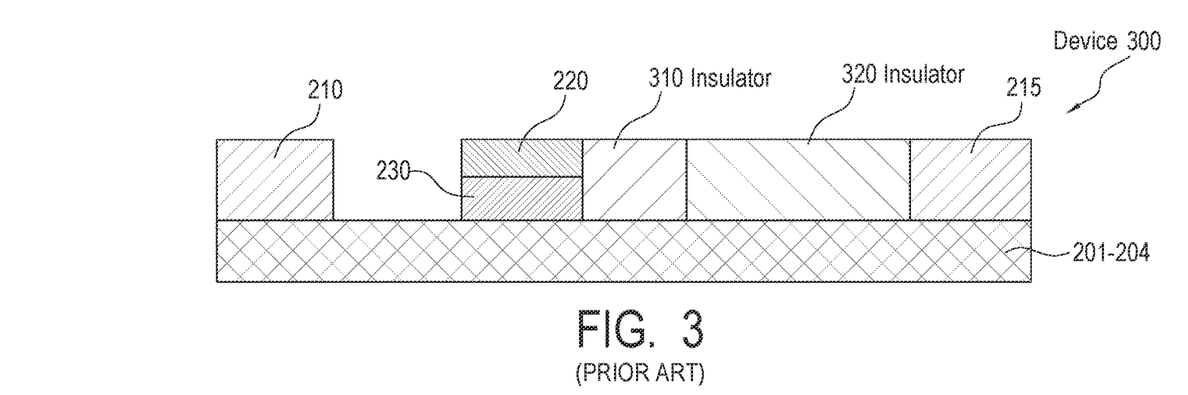
FIG. 3 illustrates a cross-sectional view of the conventional GaN transistor shown in FIG. 2 with two different insulators between the gate and drain contacts.

FIG. 3 illustrates a cross-sectional view of a conventional GaN transistor 300 with two different insulators 310 and 320 between the gate and drain contacts. Device 300 is similar to device 200 shown in FIG. 2, but includes insulators 310 and 320 disposed between the gate contact 220 and the drain contact 215 and above the layers 201-204. The first insulator 310 is closer to gate contact 220 than the second insulator 320. The second insulator 320 is adjacent to the first insulator 310 and closer to drain contact 215 than the first insulator 310. The first insulator 310 has a lower density of electron donors than the second insulator 320, such that the net electron donor density above barrier layer 204 is lower under the first insulator than under the second insulator.

In some implementations, insulator 320 is formed with a thickness in the range of about 50-500 nanometers (nm) and is made of SiN deposited at a high temperature in the range of about 600-900° C. Insulators 310 and 320 can be formed of the same material but with different process conditions, such that insulator 310 produces a lower interface density of donor states than insulator 320. Many process conditions and factors can influence the density of donor states in a material, such as surface cleaning, plasma exposure, pre-deposition surface preparation and gas sequencing. In some examples, the lowest interface density is used in the "high interface density" region and an insulator offset layer is included to add controllable doping to device 300. The insulator offset layer is described further herein with reference to device 400 shown in FIG. 4.

"Net doping" refers to the combination of surface donors and intentional doping of the barrier layer 204 and any insulator offset layer in that region. The net doping in the region between insulator 310 and the channel is less than the net doping in the region between insulator 320 and the channel. Net doping in the regions can be controlled by surface deposition actions, such as high temperature exposure to ammonia ($NH_3$) for about 1-10 minutes at temperatures of about 300-800° C. to control interface state density. Barrier 204 can be doped through flow of silane ($SiH_4$) during deposition, such as setting the $SiH_4$ flow rate to be about 1/1000th of the tri-methyl-gallium (TMG) flow rate during the barrier layer growth performed at about 700-1200° C.

Figure 4:
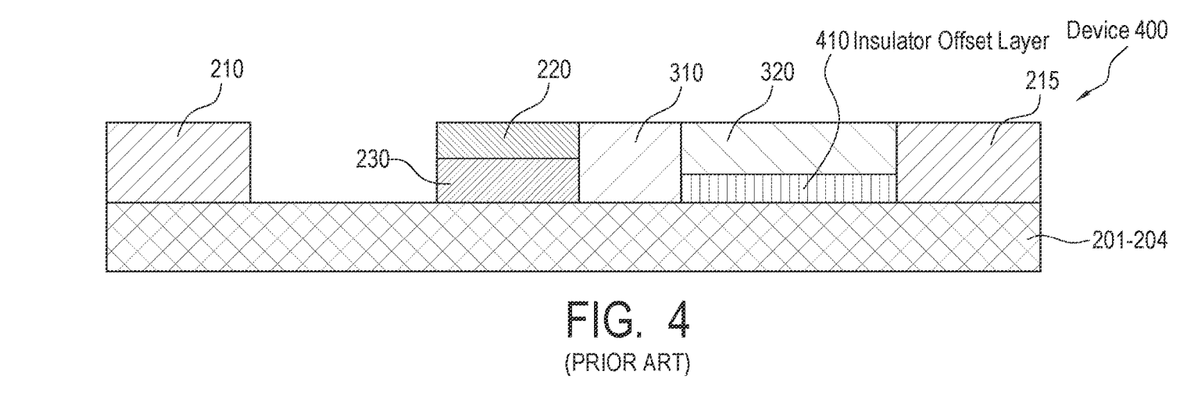
FIG. 4 illustrates a cross-sectional view of a conventional GaN transistor with two different insulators between the gate and drain contacts and an insulator offset layer.

FIG. 4 illustrates a cross-sectional view of a conventional GaN transistor 400 with an insulator offset layer 410. Device 400 is similar to device 300 shown in FIG. 3, but includes the insulator offset layer 410 positioned between the barrier layer 204 and the second insulator 320. The insulator offset layer 410 can comprise one or more of AlN, AlGaN, and GaN materials. The insulator offset layer 410 increases the distance between insulator 320 and the barrier layer 204, moving the insulator farther from the channel.

The limit of the voltage for device 400 before the on-resistance changes is caused by high electric fields and "hot electrons." When $I_{LEAKAGE}$ occurs, the electrons travel in the region below the barrier layer 204, from the gate 220/source 210 side to the drain side 215. In regions with high electric fields, electrons travel faster and can gain large amounts of energy. Fast-moving and high-energy electrons may hit something and scatter, potentially out of the channel into places in the barrier layer 204, into the interface, into the insulator 320 above barrier layer 204, or into the buffer layer 203, and become trapped there. The insulator offset layer 410 increases the distance fast-moving and high-energy electrons must travel to become trapped in insulator 320.

In some implementations, the insulator offset layer 410 is doped with donor atoms to reduce the activation energy and switching time for device 400. Insulator offset layer 410 can be doped by flow of $SiH_4$ at a rate of about 1/1000th of the tri-methyl-gallium (TMG) flow rate during insulator offset layer growth at 700-1200° C. In some implementations, the insulator offset layer 410 is also positioned between one or more of the source contact 210 and drain contact 215 to reduce ohmic contact resistance between the contacts and the channel.

Figure 5:
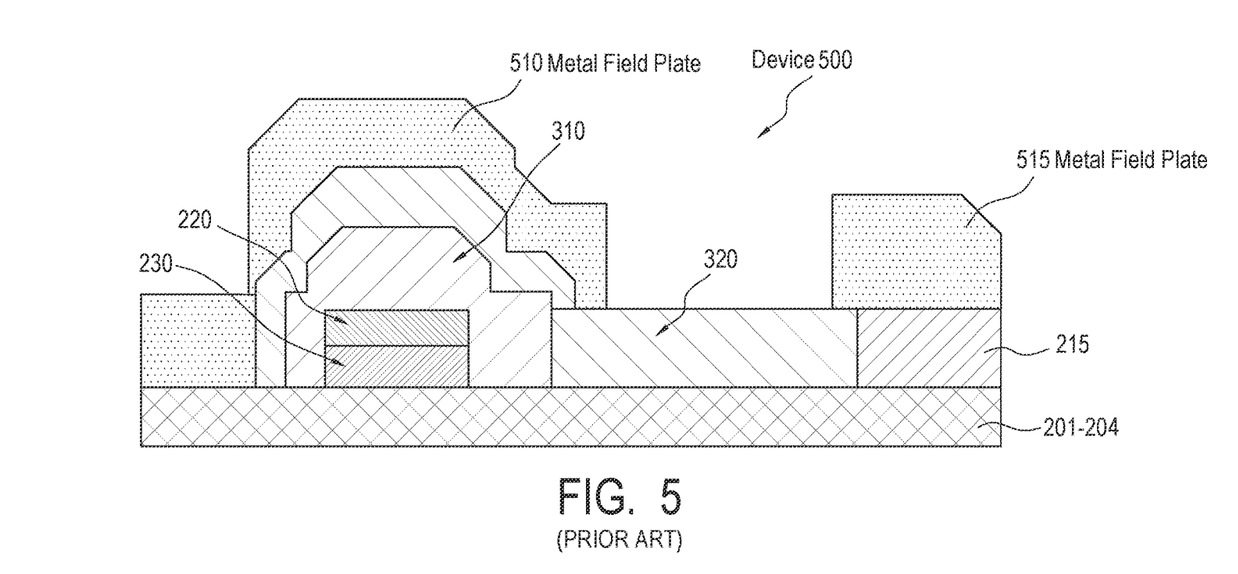
FIG. 5 illustrates a cross-sectional view of a conventional GaN transistor with two different insulators between the gate and drain contacts and metal field plates.

FIG. 5 illustrates a cross-section view of a conventional GaN transistor 500 with two different insulators 310 and 320 between the gate and drain contacts and metal field plates 510 and 515, as disclosed in co-owned U.S. Pat. No. 10,096,702, the disclosure of which is herein incorporated by reference. Device 500 is similar to device 300 shown in FIG. 3, but includes a first metal field plate 510 disposed over the gate contact 220 and a second metal field plate 515 over the drain contact 215. Insulator 310 covers compensated semiconductor layer 230 and gate contact 220. Insulator 320 is layered over a portion of the barrier layer 204 and insulator 310 in its entirety. Metal field plates 510 and 515 are used to shape the electric field in the high-field region of device 500 to reduce the peak electric field and increase the device breakdown voltage. Metal field plate 510 is positioned over compensated semiconductor layer 230, gate contact 220, and insulator 310 in its entirety and positioned over only a portion of insulator 320. Metal field plate 510 protects the gate region from high electric fields. Metal field plate 515 is positioned over drain contact 215 and a portion of insulator 320.

The various layers in devices 300, 400, and 500 may be formed using the processes described for fabricating the device 200 in co-owned U.S. Pat. No. 8,350,294, the disclosure of which is herein incorporated by reference. For example, the buffer, channel, barrier, and gate layers may each be formed by nucleation. The gate metal is deposited, patterned, and etched. Insulator 310 is deposited, patterned, and selectively etched to stop etching on barrier layer 204. Insulator 320 is then deposited, patterned, and etched to form ohmic openings. Metal is then deposited, patterned, etched, and annealed to form ohmic contacts to the barrier layer 204 and/or to form one or more field plates such as metal field plates 510 and 515.

Figure 6:
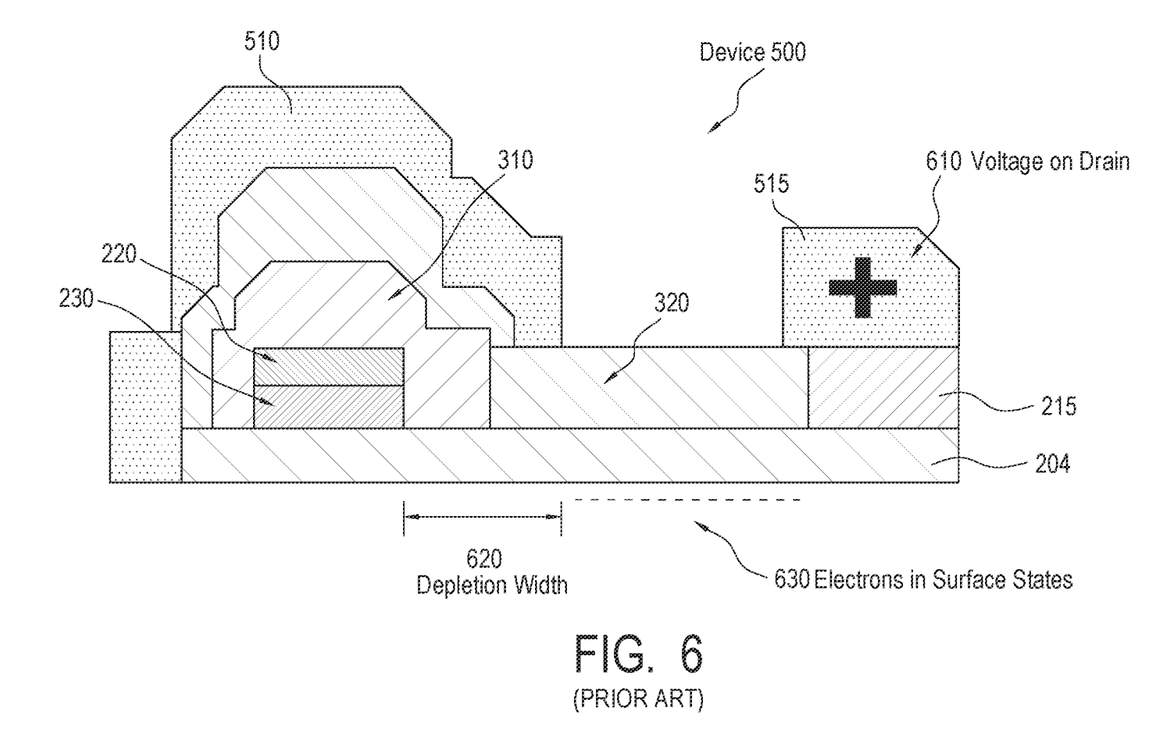
FIG. 6 illustrates a cross-sectional view of the conventional GaN transistor shown in FIG. 5 with a depiction of electron depletion width when a voltage is applied to the drain contact.

FIG. 6 illustrates a cross-sectional view of the conventional GaN transistor 500 shown in FIG. 5 with a depiction of electron depletion width when a voltage is applied to the drain contact. When voltage 610 is applied to drain contact 215 through metal field plate 515, electrons 630 from the surface states and 2DEG are pulled toward the positive voltage. The region in which electrons are depleted starts at the edge of gate contact 220 and extends a distance toward drain contact 215, known as the depletion width 620. The higher the voltage 610 applied to drain contact 215 and metal field plate 515, the larger the depletion width 620.

Figure 7:
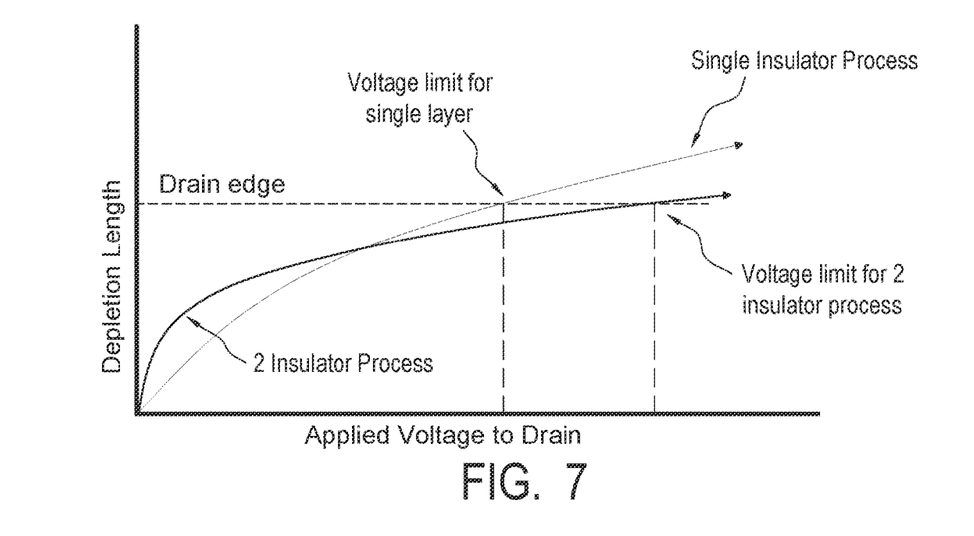
FIG. 7 illustrates a plot of depletion length vs. voltage applied to the drain contact to compare the behavior of the single insulator conventional GaN transistor shown in FIG. 1 and the two insulator conventional GaN transistor shown in FIG. 5.

FIG. 7 illustrates a plot of depletion length vs. applied voltage to drain for the GaN transistor 300 and for a GaN transistor with only a single insulator. A low bias region corresponding to the first insulator 310 has a faster increase in depletion length than the GaN transistor with only a single insulator. The faster increase in depletion length for GaN transistor 300 compared to the GaN transistor with only a single insulator causes GaN transistor 300 to have a lower gate to drain charge ($Q_{GD}$) and causes less charge to be pulled into gate contact 220. A high bias region corresponding to the second insulator 320 has a slower increase in depletion length than the GaN transistor with only a single insulator. Once the depletion length reaches edge of the drain contact 215, the resistances of the transistors begin to change. GaN transistor 300 can withstand higher voltages before its resistance changes than the GaN transistor with only a single insulator.

The two insulator process improves on the passivating insulator layer by allowing selection of two different insulators for two different purposes. The characteristics of the first insulator 310 are chosen to reduce $I_{LEAKAGE}$ and fields near gate contact 220 that cause high $Q_{GD}$. The characteristics of the adjacent second insulator 320 are chosen to reduce electric fields at the drain contact 215 and provide a high density of charge in the channel for low resistance. A single passivating insulator fails to accomplish both. However, the two insulator process outlined in FIGS. 3 and 4 gives only limited control over the device characteristics, and may be unable to achieve precise specifications.

SUMMARY OF THE INVENTION

The present invention addresses the disadvantages of single and two insulator processes in achieving desired transistor characteristics by providing a column III nitride transistor, preferably a GaN transistor, that includes multiple insulator semiconductor interface regions to balance reduced leakage current and gate to drain capacitance with high electron density in the channel and low drain fields during device operation.

More specifically, the present invention, as described herein, comprises a column III nitride transistor with interleaving segments of different insulators. The transistor includes a buffer layer comprising a column III nitride material; a barrier layer immediately above the buffer layer and comprising a column III nitride material; a channel comprising a conductive 2DEG formed in the buffer layer at the junction with the barrier layer; gate, drain, and source contacts; and two or more first insulator segments and two or more second insulator segments above the barrier layer and at least between the gate and drain contacts. The first insulator segments are interleaved with the second insulator segments, and at least one first insulator segment is nearer to the gate contact than the second insulator segments. At least one second insulator segment is nearer to the drain contact than the first insulator segments. The net electron donor density above the channel under the first insulator segments is lower than a net electron density above the channel under the second insulator segments.

In a further embodiment, the first insulator segments and the second insulator segments are each positioned immediately above the barrier layer. In another embodiment, the transistor further comprises an insulator offset layer positioned at least between the second insulator segments and the barrier layer. The insulator offset layer may comprise a column III nitride material, and may or may not be doped. In some embodiments, the insulator offset layer is further positioned between the drain contact and the barrier layer.

In an embodiment, the first insulator segments and the second insulator segments are equal widths. In an embodiment, one or more of the first insulator segments is a different width than other first insulator segments. In an embodiment, one or more of the second insulator segments is a different width than other second insulator segments.

In an embodiment, the transistor further comprises at least one third insulator segment above the barrier layer and at least between the gate and drain contacts, and interleaved with the first insulator segments and the second insulator segments. In one embodiment, the third insulator segments are chosen such that a net electron donor density above the channel under the third insulator segment is lower than the net electron density above the channel under the second insulator segments but higher than the net electron density above the channel under the first insulator segments. In another embodiment, the third insulator segments are chosen such that a net electron donor density above the channel under the third insulator segment is lower than the net electron density above the channel under the first insulator segments. In a further embodiment, the third insulator segments are chosen such that a net electron donor density above the channel under the third insulator segment is higher than the net electron density above the channel under the second insulator segments.

In an embodiment, the transistor further comprises one or more metal field plates positioned above at least one of a first insulator segment and a second insulator segment and positioned at least between the gate and drain contacts. The metal field plates may or may not overlap with each other. In an embodiment, the metal field plates may be positioned above at least one boundary between a first insulator segment and a second insulator segment. The metal field plates may or may not be separated from the at least one insulator segment by the same distance, and may or may not be the same thicknesses. The metal field plates may or may not be slanted, and may or may not be multi-stepped plates with varying heights.

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

Figure 8:
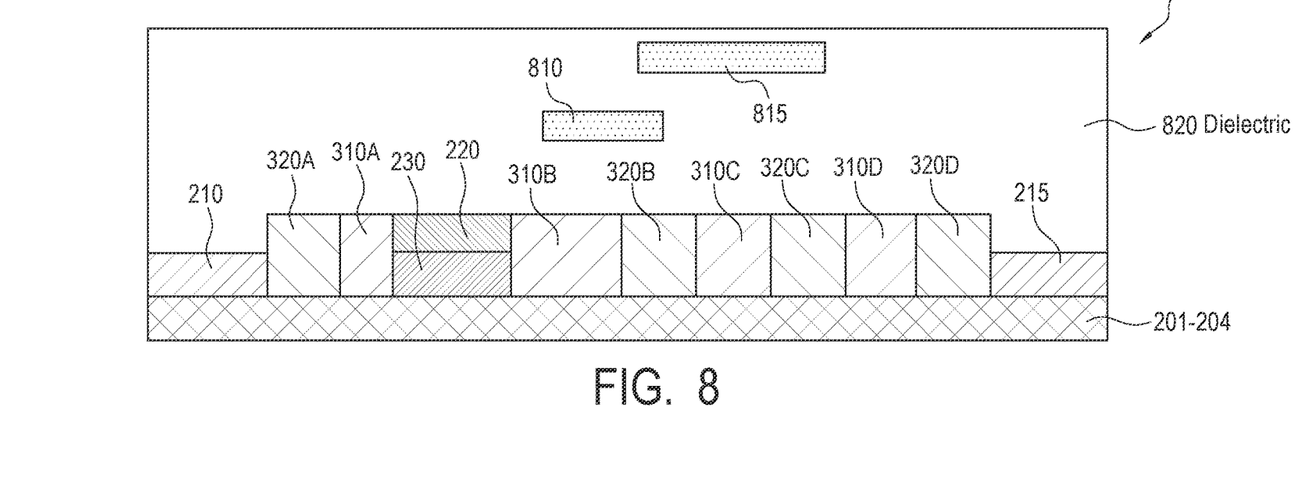
FIG. 8 illustrates a cross-sectional view of a GaN transistor formed according to a first embodiment of the present invention.

FIG. 8 illustrates a cross-sectional view of a GaN transistor 800 formed according to a first embodiment of the present invention. Device 800 is similar to device 300 shown in FIG. 3, but includes multiple interleaved segments of insulators 310 and 320 and a first metal field plate 810 and a second metal field plate 815. Device 800 includes a segment of insulator 310A and a segment of insulator 320A between source contact 210 and gate contact 220. Additional segments of insulator 310B, 310C, and 310D are interleaved with additional segments of insulator 320B, 320C, and 320D between gate contact 220 and drain contact 215. Insulator 310 is chosen to reduce $I_{LEAKAGE}$ and electric fields that cause high $Q_{GD}$, and insulator 320 is chosen to reduce electric fields at the drain contact 220 and provide a high density of charge in the channel for low resistance.

Although device 800 includes three sections each of insulators 310 and 320 between gate contact 220 and drain contact 215, any number of sections can be included based on the gate to drain width to achieve the desired carrier density and depletion rate. Similarly, the segments of insulator 310A, 310B, 310C, and 310D and the segments of insulator 320A, 320B, 320C, and 320D need not be the same width.

The first metal field plate 810 is narrower than the second metal field plate 815 and overlaps the boundary between insulator 310B and insulator 320B. The second metal field plate 815 overlaps with metal field plate 810 and with the boundaries between insulator 320B, 310C, and 320C. Metal field plate 815 is separated from the insulators 310 and 320 by a greater distance than metal field plate 810 is separated from them. The space between and around metal field plates 810 and 815, and above insulators 310 and 320, gate contact 220, source contact 210, and drain contact 215 is filled by a dielectric 820.

Although device 800 includes two metal field plates 810 and 815, fewer or more metal field plates can be included based on the desired switching times and desired device breakdown voltage for device 800. Similarly, although metal field plate 810 covers one boundary between insulators 310 and 320 and metal field plate 815 covers two boundaries between insulators 310 and 320, fewer or more boundaries can be covered. In some implementations, metal field plates 810 and 815 have the same width. In some implementations, metal field plates 810 and 815 do not overlap with one another. In some implementations, one or more of metal field plates 810 and 815 are multi-stepped metal field plates with different heights, as illustrated in FIG. 9.

Figure 9:
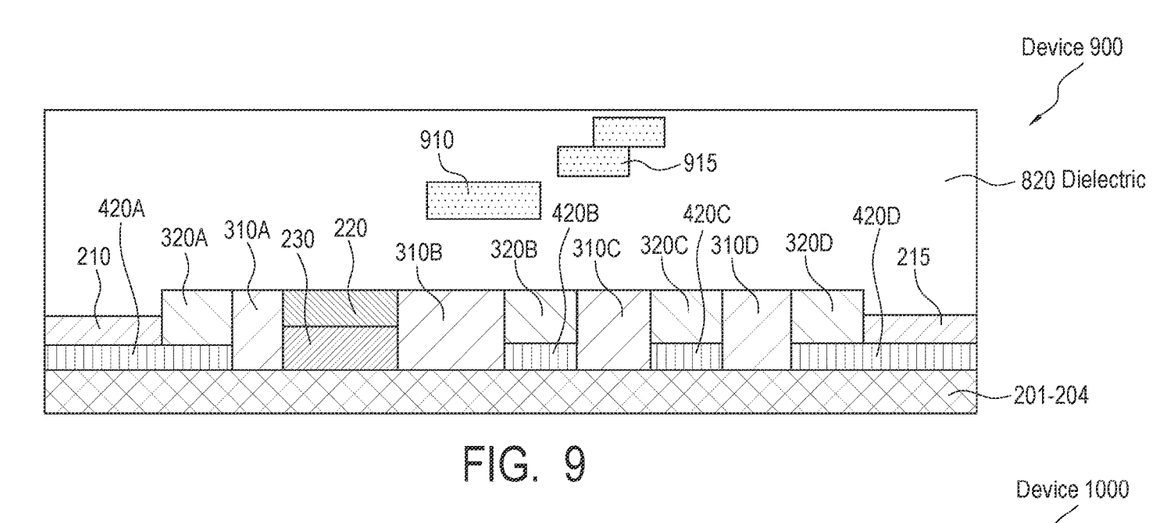
FIG. 9 illustrates a cross-sectional view of a GaN transistor formed according to a second embodiment of the present invention.

FIG. 9 illustrates a cross-sectional view of a GaN transistor 900 formed according to a second embodiment of the present invention. Device 900 is similar to device 800 shown in FIG. 8, but includes an insulator offset layer 420 such as the insulator offset layer described herein with reference to FIG. 4. Segments of the insulator offset layer 420A, 420B, 420C, and 420D are disposed between the segments of insulator 320A, 320B, 320C, and 320D and the barrier layer 204 and between source contact 210 and drain contact 215. Metal field plates 910 and 915 are similar to metal field plates 810 and 815 in device 800, but metal field plate 910 is thicker than metal field plate 810 to illustrate an additional parameter that can be adjusted to achieve the desired switching time and breakdown voltage. Metal field plate 915 is a multi-step metal field plate with varying heights.

Figure 10:
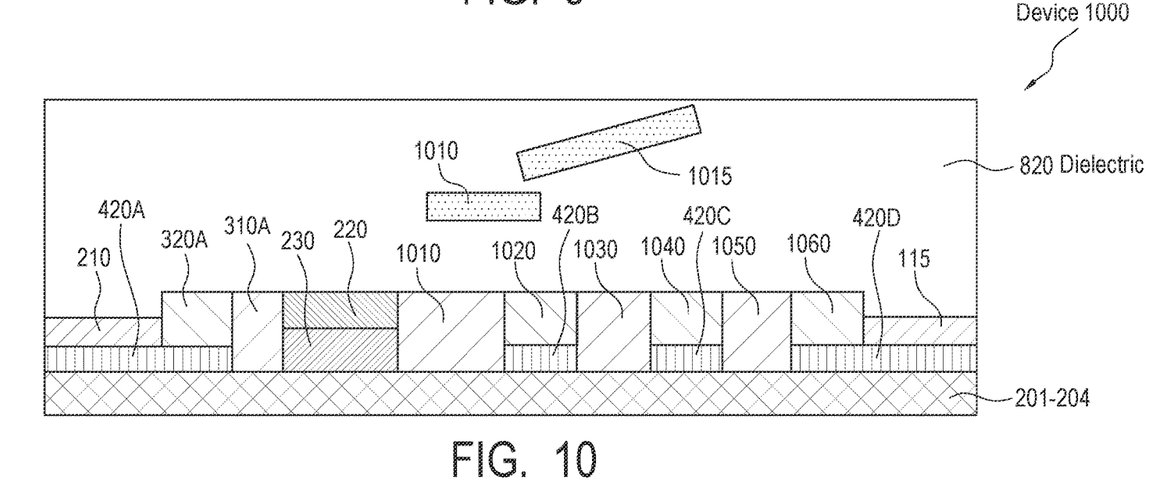
FIG. 10 illustrates a cross-sectional view of a GaN transistor formed according to a third embodiment of the present invention.

FIG. 10 illustrates a cross-sectional view of a GaN transistor 1000 formed according to a third embodiment of the present invention. Device 1000 is similar to device 900 shown in FIG. 9, but includes a variety of insulators in addition to insulators 310 and 320. Metal field plates 1010 and 1015 are similar to metal field plates 810 and 815 in device 800, but metal field plate 1015 is slanted. The distance between the left end of metal field plate 1015 and insulator 1020 is less than the distance between the right end of metal field plate 1015 and insulator 1040 to illustrate an additional parameter that can be adjusted to achieve the desired device breakdown voltage and switching times.

Insulators 1010, 1020, 1030, 1040, 1050, and 1060 may each be different materials with different properties, or some subset of the insulators may be the same material with the same properties. Insulators 1020, 1040, and 1060 are positioned over the insulator offset layer 420 and can be chosen to provide the charge density in the channel corresponding to the desired resistance. Similarly, insulator 1010 can be chosen to reduce $I_{LEAKAGE}$ and electric fields near the gate that cause high $Q_{GD}$. Insulators 1030 and 1050 can be chosen to modulate the charge density in the channel between gate contact 220 and drain contact 215.

Multiple segments of insulators of different types between the gate contact and the drain contact can be used to achieve the desired transistor characteristics such as a threshold $I_{LEAKAGE}$, threshold electric fields near the gate contact, threshold electric fields near the drain contact, breakdown voltage, and threshold density of charge in the channel for a desired on-resistance. Any number of segments of insulators with the same or different widths and any number of different insulator types can be used to achieve the desired transistor characteristics. An insulator offset layer may be included or omitted based on the chosen insulators and desired transistor characteristics. Any number or no metal field plates may also be included. The metal field plates may be separated from the insulator segments by the same or different distances, have the same or different widths and thicknesses, and overlap any number or no boundaries between insulator segments. Similarly, the metal field plates may be slanted or multi-stepped.

Figure 11:
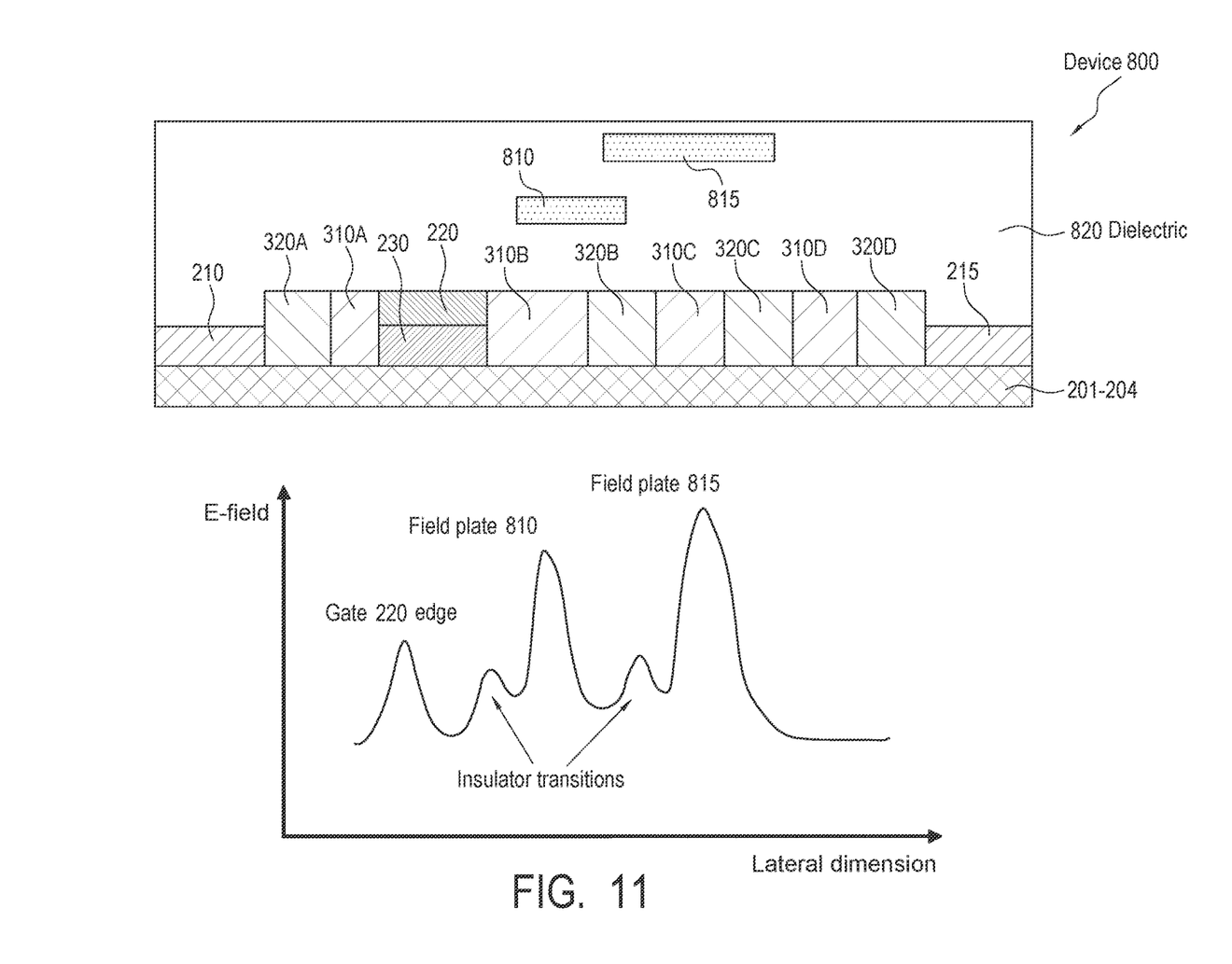
FIG. 11 a plot of electrostatic field distribution for the GaN transistor with multiple interleaving insulator segments formed according to the first embodiment of the present invention.

FIG. 11 shows a plot of electrostatic field distribution for the GaN transistor with multiple interleaving insulator segments formed according to the first embodiment of the present invention. The electrostatic field has peaks at transition points: at the edge of gate contact 220 to first insulator segment 310A, at the metal field plate 810, at the edge of first insulator segment 310B to the second insulator segment 320B, at the edge of the second metal field plate 815, and the like. The multiple interleaving insulator segments and the metal field plates reduce the peak values of the electrostatic field and smooth the overall electrostatic field distribution such that increases and decreases are not as sharp as in the electrostatic field distribution of the conventional two insulator GaN transistor shown in FIG. 5.

Figure 12A:
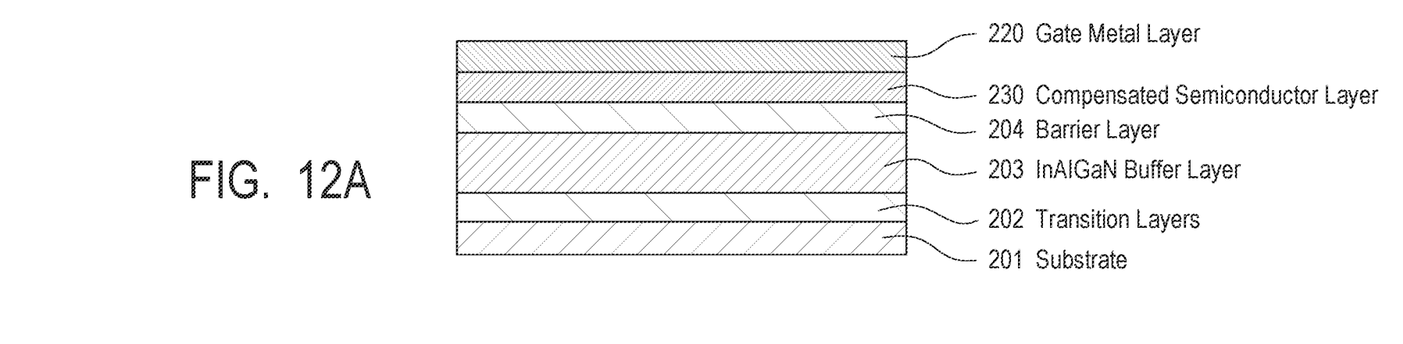
FIGS. 12A-G illustrate an exemplary process flow for fabricating the GaN transistor according to the first embodiment of the present invention.
Figure 12B:
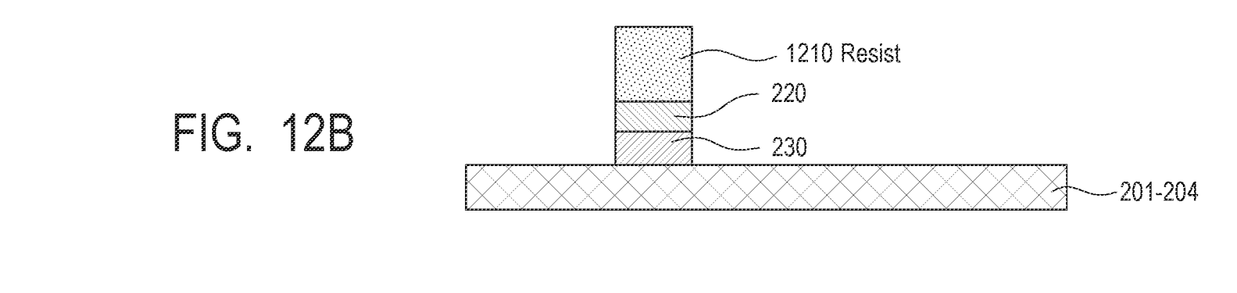
Figure 12C:
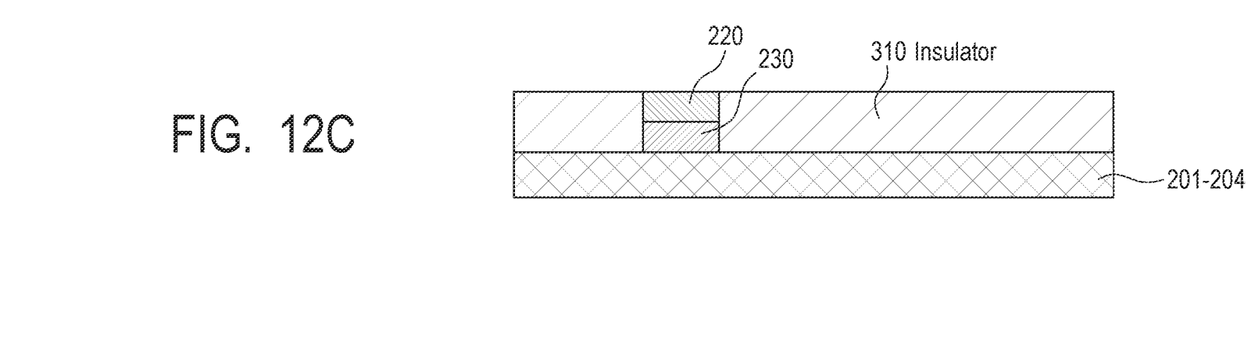
Figure 12D:
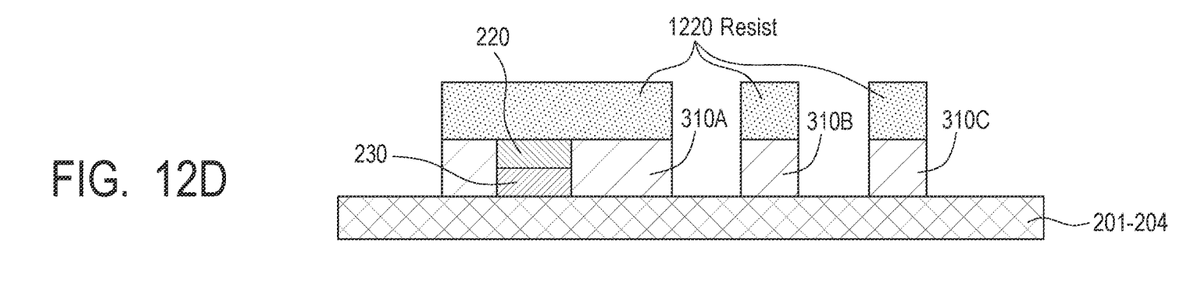
Figure 12E:
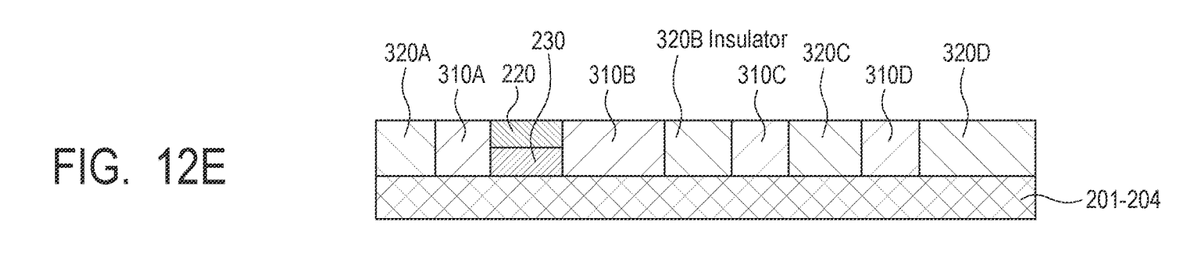
Figure 12F:
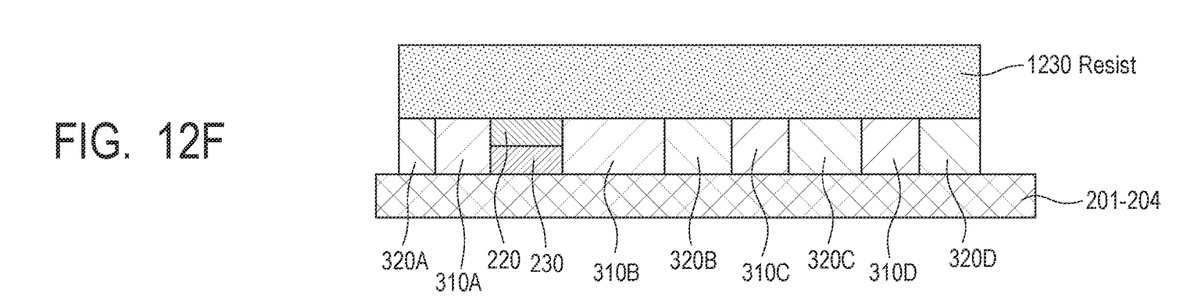
Figure 12G:
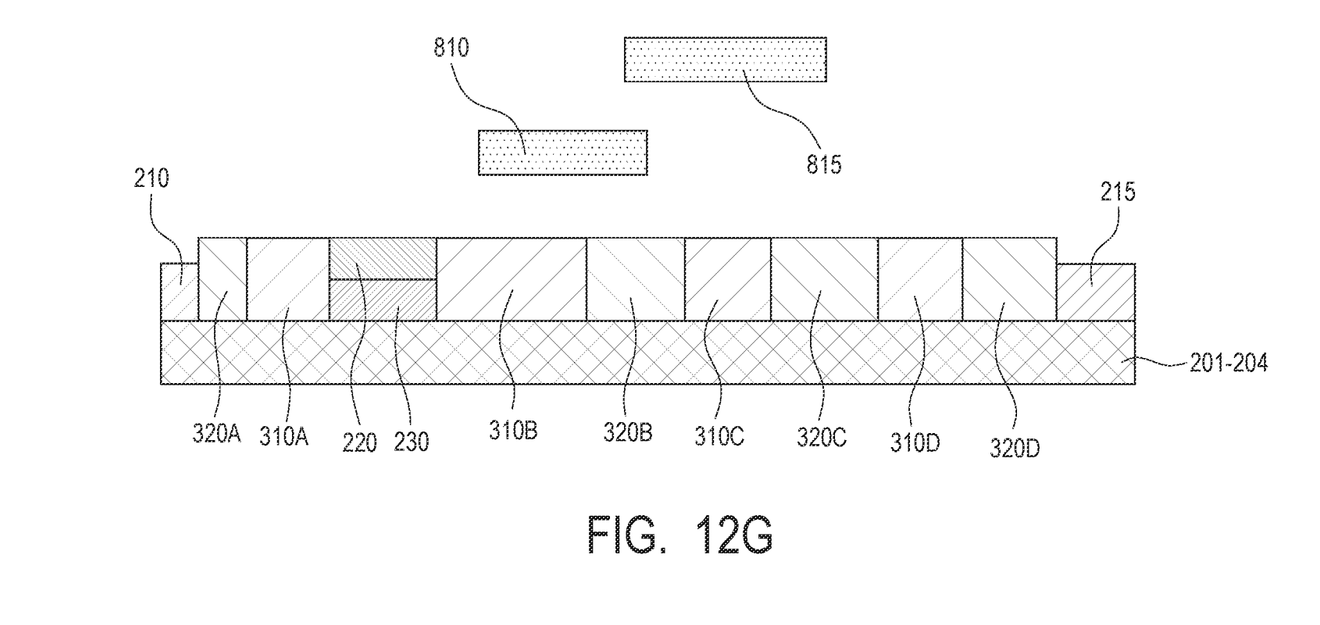

FIGS. 12A-G illustrate an exemplary process flow for fabricating the GaN transistor 800 shown in FIG. 8. FIG. 12A shows the result of growing the epitaxial layers 201-204, the compensated semiconductor layer 230 and depositing the gate metal layer 220. FIG. 12B shows the result of masking the gate contact with resist 1210 and etching the excess gate metal and compensated semiconductor material. FIG. 12C shows the result of stripping resist 1210 and depositing insulator 310. FIG. 12D shows the result of masking segments of insulator 310A, 310B, and 310C with resist 1220 and etching the excess insulator 310. FIG. 12E shows the result of stripping resist 1220 and depositing insulator 320 into segments 320A over insulator 310A and the gate contact, 320B, and 320C. FIG. 12F shows the result of masking insulator 310 and selective segments of insulator 320 with resist 1230 and etching insulator 320 from the places for source contact 210 and drain contact 215. FIG. 12G shows the result of stripping resist 1230 and depositing metal for source contact 210, drain contact 215, and metal field plates 810 and 815.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A column III nitride transistor comprising:
   a buffer layer comprising a column III nitride material;
   a barrier layer immediately above the buffer layer and comprising a column III nitride material;
   a channel comprising a conductive two-dimensional electron gas (2DEG) formed in the buffer layer at a junction with the barrier layer;
   gate, drain, and source contacts above the barrier layer, wherein the gate contact is positioned between the source and drain contacts; and
   two or more first insulator segments and two or more second insulator segments above the barrier layer and at least between the gate and drain contacts, wherein:
   the first insulator segments are interleaved with the second insulator segments,
   at least one of the first insulator segments is nearer to the gate contact than the second insulator segments,
   at least one of the second insulator segments is nearer to the drain contact than the first insulator segments, and
   a net electron donor density above the channel under the first insulator segments is lower than a net electron density above the channel under the second insulator segments.

2. The transistor of claim 1, wherein the first insulator segments and the second insulator segments are each positioned immediately above the barrier layer.

3. The transistor of claim 1, further comprising an insulator offset layer positioned at least between the second insulator segments and the barrier layer.

4. The transistor of claim 3, wherein the insulator offset layer comprises a column III nitride material.

5. The transistor of claim 4, wherein the column III nitride material comprising the insulator offset layer is doped.

6. The transistor of claim 3, wherein the insulator offset layer is further positioned between the drain contact and the barrier layer.

7. The transistor of claim 1, wherein the first insulator segments and the second insulator segments are equal widths.

8. The transistor of claim 1, wherein the first insulator segments are different widths.

9. The transistor of claim 1, wherein the second insulator segments are different widths.

10. The transistor of claim 1, further comprising at least one third insulator segment above the barrier layer and at least between the gate and drain contacts, wherein the third insulator segment is interleaved with the first insulator segments and the second insulator segments.

11. The transistor of claim 10, wherein a net electron donor density above the channel under the third insulator segment is lower than the net electron density above the channel under the second insulator segments but higher than the net electron density above the channel under the first insulator segments.

12. The transistor of claim 10, wherein a net electron donor density above the channel under the third insulator segment is lower than the net electron density above the channel under the first insulator segments.

13. The transistor of claim 10, wherein a net electron donor density above the channel under the third insulator segment is higher than the net electron density above the channel under the second insulator segments.

14. The transistor of claim 1, further comprising a metal field plate positioned above at least one of a first insulator segment and a second insulator segment and positioned at least between the gate and drain contacts.

15. The transistor of claim 14, wherein the metal field plate is positioned above at least one boundary between a first insulator segment and a second insulator segment.

16. The transistor of claim 14, wherein the metal field plate is slanted such that a distance between a first end of the metal field plate and the at least one insulator segment is less than a distance between a second end of the metal field plate and the at least one insulator segment.

17. The transistor of claim 14, wherein the metal field plate comprises multiple steps with varying heights.

18. The transistor of claim 14, wherein the metal field plate comprises a first metal field plate, the transistor further comprising a second metal field plate positioned above at least one of a first insulator segment and a second insulator segment and positioned at least between the gate and drain contacts.

19. The transistor of claim 18, wherein the first and second metal field plates overlap.

20. The transistor of claim 18, wherein the first and second metal field plates are separated from the at least one insulator segment by different distances.

21. The transistor of claim 18, wherein the first and second metal field plates have different thicknesses.

* * * * *